(12) United States Patent
Ananth

(10) Patent No.: US 6,201,446 B1
(45) Date of Patent: Mar. 13, 2001

(54) ADAPTIVE BANDWIDTH STABILIZATION FOR AN INTEGRATED CIRCUIT AMPLIFIER

(75) Inventor: Ravi Shankar Ananth, Richmond Hill (CA)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/348,610

(22) Filed: Jul. 6, 1999

(30) Foreign Application Priority Data

Jul. 9, 1998 (CA) .................................................. 2242724

(51) Int. Cl.[7] ................................. H03F 3/08; H03F 3/45
(52) U.S. Cl. ......................... 330/308; 330/261; 330/292
(58) Field of Search ..................................... 330/257, 285, 330/292, 307, 308, 67, 261; 250/214 A, 214 AG

(56) References Cited

U.S. PATENT DOCUMENTS

| 5,225,790 | * | 7/1993 | Noguchi et al. ..................... 330/260 |
| 5,420,542 | * | 5/1995 | Harvey ................................. 330/292 |
| 5,432,474 | * | 7/1995 | Lauffenburger et al. ........ 330/308 X |

* cited by examiner

Primary Examiner—Steven J. Mottola
(74) Attorney, Agent, or Firm—Tiffany L. Townsend

(57) ABSTRACT

The invention provides a stabilized integrated transimpedance amplifier comprising: an amplifier integrated on a substrate, coupling capacitors integrated into the amplifier substrate, the amplifier being adapted to have open loop amplification characteristics that compensate for changes in the capacitance of the capacitors with supply voltage of the amplifier.

16 Claims, 2 Drawing Sheets

ADAPTIVE BANDWIDTH STABILIZATION FOR AN INTEGRATED CIRCUIT AMPLIFIER

FIELD OF THE INVENTION

This invention relates to integrated circuit amplifiers having compensation for bandwidth stabilization over a wide range of operating supply voltages, and to integrated circuit infrared receivers embodying such amplifiers.

BACKGROUND OF THE INVENTION

With the increasing movement of solid state electronics from discrete component usage to integrated circuitry, such as ASICs (Application Specific Integrated Circuits), advantages have been gained in miniaturization, but certain limitations have been encountered as well. In prior art, amplification systems were built with discrete components such as capacitors and resistors being used in conjunction with high gain integrated circuit amplifiers to produce various amplifier configurations such as transconductance amplifiers. The intrinsic properties of the external components as a function of the operating voltage being used was seldom a problem, if the components were not used outside of their design voltage limitations.

The same is not necessarily the case for fully integrated circuit amplifiers where devices such as capacitors are integrated onto the same substrate as the amplifier. While the various methods of integrating capacitive devices is well known to those skilled in the art, it is also known that the parasitic capacitance of these devices to the common substrate varies with their dc-biasing. In a typical high-capacitance implementation, the capacitor is constructed by placing a polysilicon layer over an n-well region, whereby the polysilicon layer forms the top plate of the desired capacitor and the n-well forms the bottom plate of the desired capacitor. The n-well, however resides atop of the common p-type substrate that is shared with the rest of the integrated amplifier circuit. As a result, a parasitic capacitance from the n-well back plate to (grounded) substrate exists similar to that of a reverse biased pn-junction. This results in a parasitic capacitance to ground that varies inversely with the dc voltage present on the back plate of the capacitor. Where such a capacitor is used as a high pass filter, for instance, its impedance would change as a consequence of changes in the biasing voltage on the back-plate of the capacitor, thereby changing the frequency response characteristics of the amplifier. For stability in capacitance it is desirable to stabilize the bias voltage on the device. Where there is sufficient power availability to support the losses of a voltage regulator, the capacitance could be stabilized by operating the amplifier from a regulated supply voltage. Unfortunately, for battery operated devices, only a small amount of power may be available, either because of battery size limitations, or other power usage requirements, and a voltage regulator may prove impractical by reducing battery operating time, or increasing the current loading. While switching regulators may be more efficient than other regulator types, they have a tendency of introducing electrical noise and are considered impractical for small integrated low-noise amplifiers. Accordingly it does not seem to be practical to control the bias voltage on the back-plate of the capacitor and another solution is required.

SUMMARY OF THE INVENTION

It has been found that bandwidth stabilization of an integrated amplifier using capacitors integrated onto the amplifier substrate may be achieved by providing the amplifier with open loop amplification characteristics (Ao) that compensate for changes in the capacitance of its capacitors.

Another aspect of the invention provides an integrated circuit amplifier, the open loop gain (Ao) of which is made responsive to the variation in supply voltage that causes the impedance variation in its associated components.

More specifically, where voltage dependent input impedances such as integrated circuit capacitors are used in the input of an amplifier, the bandwidth of such an amplifier can be stabilized by adapting the open-loop gain of the amplifier so that it is inversely dependent on said supply voltage.

Another aspect of the invention provides an integrated circuit transconductance amplifier with integrated capacitive input coupling in which the amplifier is compensated for supply voltage variation to provide controlled bandwidth by adapting the amplifier so that its open-loop gain varies inversely with the supply voltage.

In one embodiment, the invention provides an integrated circuit transconductance amplifier, powered by a supply voltage, the amplifier having input and output ports, and an integrated input hi-pass coupling capacitor biased indirectly by said supply voltage, the parasitic capacitance of said capacitor being dependent on said supply voltage, coupled to an input port of said amplifier. In one method of forming an integrated circuit capacitor, the reverse biased pn junction on the back-plate of the capacitor has a parasitic capacitance which increases with decreasing bias voltage.

The open-loop gain of said amplifier is adapted to depend inversely on said supply voltage, tracking the inverse dependance of the parasitic capacitance of said capacitor to the said supply voltage.

In one particular embodiment, the amplifier comprises at least one amplifying transistor connected to a loading impedance and a bias current element. In a differential amplifier, ie. one having two amplifying transistors, each amplifying transistor has its own loading impedance, but a single bias current element can be used to control bias current in either the single ended or differential configuration.

In order to control the open loop gain of the amplifier, the bias current of each amplifying transistor can be controlled and made responsive substantially inversely to supply voltage. This can be done by controlling the bias current element as a function of supply voltage.

One embodiment for achieving this is the configuration in which the bias current element comprises a transistor which is connected to a reference current source (diode connected transistor) to form a first current mirror circuit, wherein the current flowing through the bias current element transistor is proportional to (mirrors) the current flowing through the reference current source. The reference current source may be configured so that its current varies inversely with the supply voltage.

This can be achieved as follows: biasing the reference source by a fixed reference voltage and having it connected in parallel to a mirror transistor element of a second current mirror circuit, the second current mirror circuit also including a reference current source (diode connected transistor) biased by the supply voltage. The current from the second current mirror circuit acts subtractively to reduce the current in the first current mirror circuit. This has the effect of increasing the current to the amplifier transistor(s) and thereby increasing the amplifiers open-loop gain when the supply voltage decreases as less current is being drawn by the second mirror circuit when the supply voltage is reduced.

This happens at the same time as the parasitic capacitance of the input capacitor increases due to the decreasing voltage. As a result the open loop gain of the amplifier is increased for supply voltage reduction and the bandwidth or high frequency cutoff of the transconductance amplifier can be stabilized with respect to supply voltage effects with the appropriate choice of circuit component values.

In a photosensitive receiver application of the above transconductance amplifier using a differential configuration, a reverse biased photo diode is connected across the inputs of the amplifier, so that current flows through the diode in proportion to the intensity of light falling on it. The high pass input capacitors exclude the DC and low frequency light variations allowing high frequency data signals to be amplified.

SPECIFIC EMBODIMENT OF THE INVENTION

In battery operated circuits, the battery voltage can vary by as much as 50% during the course of operation as the battery discharges. For integrated circuits, this can change the internal dynamics of their operation. For instance, in the circuit of FIG. 1, which illustrates a sensitive low-noise preamplifier circuit used for infrared signal detection, it is important that a constant and controllable bandwidth be maintained in order to ensure that the same signal to noise ratio is maintained at all supply voltages. Failure to do so, would result in a more limited operational voltage range as amplifier sensitivity would degrade outside the range.

Figure 1:
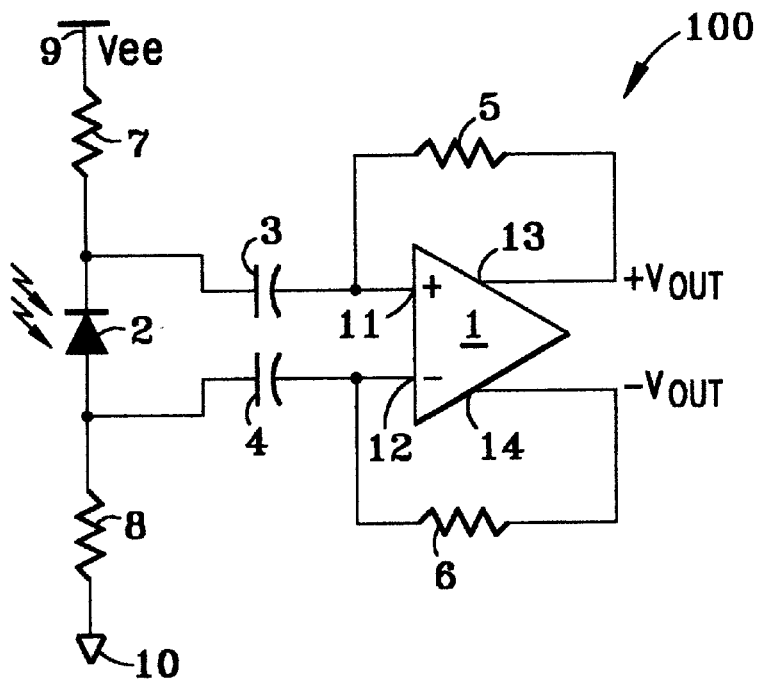
FIG. 1 is a schematic diagram of an integrated circuit infrared receiver using a reverse biased infrared photo diode, integrated high pass capacitors in a transimpedance amplifier configuration.

Referring to FIG. 1 which illustrates an integrated circuit infrared receiver 100 using a reverse biased infrared photo diode 2, integrated high pass capacitors 3, 4, and feedback resistors 5, 6 in a transimpedance differential amplifier configuration; it can be seen that the integrated high-pass capacitors 3, 4 are used in series with the inputs 11, 12 of amplifier 1 to filter out ambient or low frequency infrared noise.

The infrared photo diode 2 is used in a photo conductive mode by reverse biasing it across supply voltage Vee 9 and ground 10 using bias resistors 7, 8 as will be understood by those familiar with the art. When infrared light strikes photo diode 2 a photo current is generated flowing from cathode to anode, i.e. in the direction opposite to that of a diode used in the conventional manner.

Figure 2:
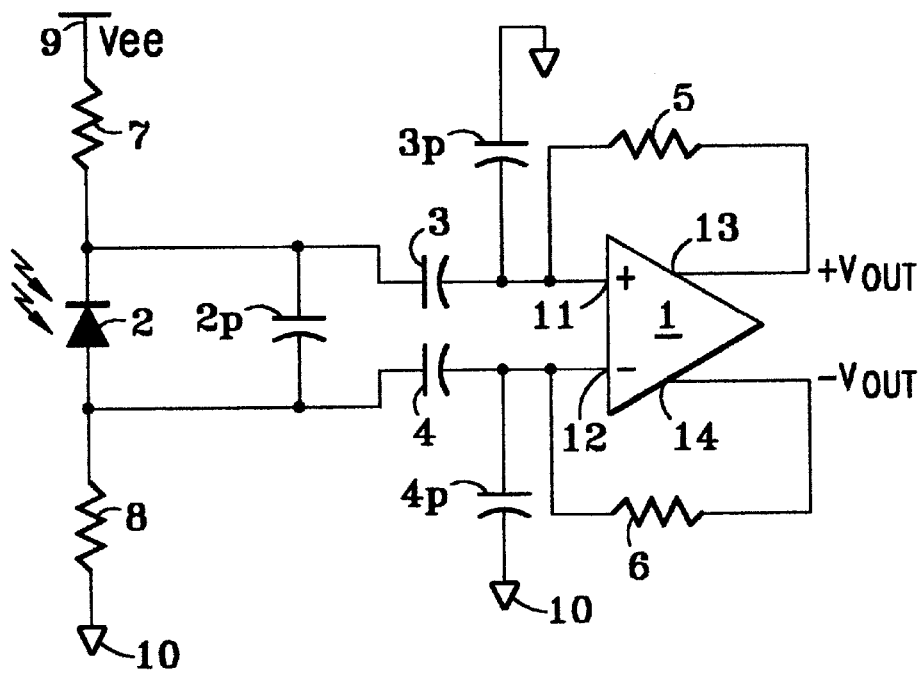
FIG. 2 is a schematic diagram of the circuit of FIG. 1 illustrating associated parasitic capacitances.

Referring to FIG. 2 which is based on diagram of the circuit of FIG. 1 illustrating associated parasitic capacitances; it may be understood that the reverse biasing of the photo diode 2 generates a depletion capacitance Cj 2 p the value of which varies inversely with the supply voltage Vee 9. In the embodiment of the invention described supply voltage Vee is kept constant so that there should be no variation in its capacitance due to voltage variations.

Integrated high pass capacitors 3, 4 are formed using integrated circuit technology on the substrate used to form amplifier 1 for compactness and efficiency. In a typical high-capacitance implementation, the capacitor is constructed by placing a polysilicon layer over an n-well region, whereby the polysilicon layer forms the top plate of the desired capacitor and the n-well forms the bottom plate of the desired capacitor. The n-well, however resides atop the common p-type substrate that is shared with the rest of the integrated amplifier circuit. As a result, a parasitic capacitance from the n-well back plate to the (grounded) substrate exists similar to that of the depletion capacitance formed in a reverse biased pn-junction. This results in a parasitic capacitance to ground that varies inversely with the dc voltage present on the back plate of the capacitor. This is unlike the situation with a discrete capacitor in which the amount of voltage used would not affect the value of the capacitor. In the case of the integrated capacitor described above, variations in the parasitic capacitance value of up to 25% have been observed with voltage variations of 2 V. The actual variations are dependent on the integration technology used and the capacitance structure chosen. Regardless of the actual value of parasitic variation, variation in the front-end capacitances of a low-noise amplifier has detrimental effects on the overall performance.

We have found that in the case of a high pass integrated circuit capacitor, the parasitic substrate capacitance Csub can be fairly large (25 pF to substrate for a 500 pF capacitor, for example) and that the parasitic capacitance Csub varies to a first approximation linearly with the supply voltage used for bias. For example, a typical 500 pF polysilicon over n-well capacitor can have Csub vary from 20 pF when the back-plate is at 2 Volts to 26 pF when the back-plate is at 1 Volt.

The parasitic capacitances Csub of high pass capacitors 3 and 4 are represented by 3 p and 4 p respectively in FIG. 2.

The effect of the parasitic capacitances of photo diode 2, capacitors 3, and 4 cause the following effects: Parasitic capacitance 2 p of photo diode 2 acts as a low pass filter leaking high frequency signal components from photo diode 2 to ground. The parasitic capacitances 3 p, 4 p respectively of high pass capacitors 3, 4 respectively similarly leak high frequency signal components from photo diode 2 to ground. Although these effects can be taken into account when the parasitics are invariant, it becomes more of a problem when they are not. With integrated devices, the parasitic capacitances will grow with decreasing bias voltage thus decreasing the upper frequency cutoff of the circuit and thereby reducing its bandwidth. In effect, the bandwidth of the receiver circuit illustrated in FIG. 1 is proportional to the supply voltage used for device biasing. We have found this to be undesirable in infrared data communication as the performance of the device would vary with its supply voltage. The signal to noise ratio of a receiver such as the one illustrated is related to bandwidth. It is undesirable to have the signal to noise ratio vary with supply voltage as data communication may become unreliable in some circumstances. If the bandwidth is too large the signal to noise ratio is reduced as extra noise is admitted. If the bandwidth is too small the signal level will be attenuated.

To illustrate the solution presented by the invention herein, some use will be made of some well-known electrical formulae.

The cutoff frequency, fc, of an RC circuit is given by the formula:

$$fc = 1/(2*(R*C)) \quad \text{(Equation 1)}$$

where conventional nomenclature is being used.

The input impedance of the amplifier portion of the circuit of FIG. 2 including the feedback loop occupied by resistance Rf 5, RF 6 is given by the formula:

$$Rin=Rf/Ao \quad \text{(Equation 2)}$$

where Rin is the input impedance, Rf is the value of the feedback resistance Rf 5, and Ao is the open-loop gain of amplifier 1.

For the circuit of FIG. 2, the input capacitance seen by the amplifier is:

$$Cin=Cj+(0.5*Csub) \quad \text{(Equation 3)}$$

where Cj is the depletion capacitance of the photo-diode (2 p) and Csub is the parasitic capacitance (3 p,4 p) of the high-pass capacitors (3,4) where the design value for the two capacitors is the same. The voltage dependance of Cin due to either Cj, Csub or the combination of both may be further expressed by rewriting the formula for Cin as:

$$Cin(V)=Cino*(1+a(V)) \quad \text{(Equation 4)}$$

where Cino is the initial value for Cin and the factor $(1+a(V))$ denotes the voltage dependent scaling factor for Cino.

If the voltage dependance of Cin (i.e. Cin(V)) is substituted into equation 1, one gets $$fc=½((Rf/Ao)*Cino(1+a(V)) \quad \text{(Equation 5)}$$

where one can clearly observe the voltage dependance of the low-pass cut-off frequency.

By now making the open-loop gain Ao a function of the voltage as well (as described earlier), one may represent the open-loop gain Ao as:

$$A(v)=Ao(1+a(V)) \quad \text{(Equation 6)}$$

If this relation is now substituted into equation 5 one reobtains the cutoff frequency, fc, to be:

$$fc=1/(2((Rf/(Ao(1+a(v))))*Cino(1+a(v)) \quad \text{(Equation 7)}$$

which in turn becomes:

$$fc=1/(2 ((Rf/Ao)* Cino \quad \text{(Equation 8)}$$

The cutoff frequency, fc, has now become independent of voltage as illustrated by equation 8. From this it can be seen that the bandwidth of the amplifier and hence the signal-to-noise ratio (SNR) can be kept constant over a wide voltage range, thereby ensuring proper operation of the receiver. We have found that the above conditions can be attained by designing the open loop gain Ao of amplifier 1 to increase with decreasing supply voltage since the input capacitance, Cin, increases with decreasing supply voltage. Thus the effect of decreasing voltage in a battery powered environment can be remedied over a significant voltage range, e.g. from an initial 5 volts to a final voltage of 2 volts.

Figure 3:
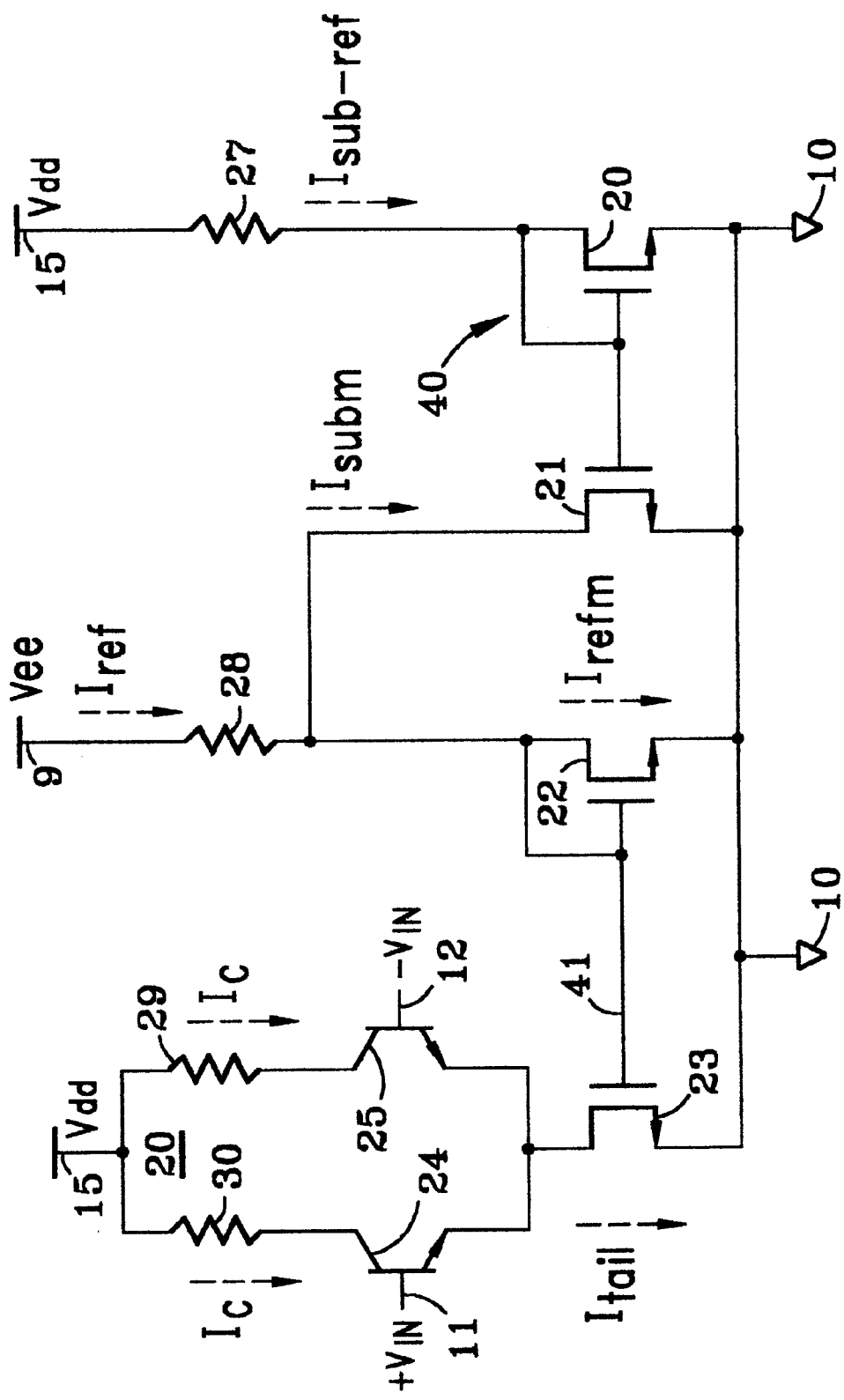
FIG. 3 is a schematic diagram illustrating a bandwidth stabilized amplifier circuit in accordance with the invention.

The amplifier circuit of FIG. 3 depicts a differential amplifier 20 together with its bias control circuitry, current mirrors 40, 41.

Although the amplifier circuit depicted is somewhat simplified in nature, it is suitable for understanding, the nature and operation of the invention. The open loop gain of amplifier 20 is proportional to the collector bias current Ic in collector resistors 29, 30 so that by controlling the collector current we can control the open loop gain. By controlling the tail current Itail using transistor 23, the collector current, Ic, can be controlled. The compensation circuitry depicted in FIG. 3 is capable of controlling the collector current by sampling the supply voltage Vdd (which may be the battery voltage or proportional to it) and adjusting the collector current Ic flowing through the final amplifying transistors 24, 25.

Current mirror circuit 40 which includes diode connected transistor 20 biased by the variable supply voltage 15 (produced by a power supply battery) is connected by its gate to the gate of transistor 21.

The current Isubm through transistor 21 mirrors the current Isub-ref (i.e. is proportional to the current) in transistor 20 so that any decrease in the supply voltage Vdd 15 will cause a reduction in current Isubm. The second current mirror circuit 41 includes diode connected transistor 22 and transistor 23 the current through which mirrors the current through transistor 22. The reference voltage Vee 9 for mirror circuit 41 is fixed in this embodiment so that the current Iref is fixed and the current through transistor 22, Irefm, becomes the difference Iref-Isubm. The current Irefin is mirrored to the final amplifiers current source transistor 23 so that its current, Itail, is proportional to Irefin and can be represented by the formula, Iref(1−b), where b varies proportionally with the supply voltage Vdd. It can be seen that when the supply voltage Vdd decreases Iref will increase, thereby increasing the open loop gain of the amplifier.

Therefore Ao is proportional to Itail which in turn is inversely proportional to the supply voltage Vdd. By setting the value of the bias resistors 27, 28 suitably, the gain of the amplifier can be made to compensate for changes in the effects of the parasitic capacitance of the high pass capacitors as the supply battery voltage decreases with use or time. As a result, the bandwidth of the receiver circuit can be held constant over a range of supply voltage.

Having described and illustrated the principles of the invention in a preferred embodiment, it should be apparent that the invention can be modified without departing from the principles. Accordingly I claim all modifications and variations coming within the scope of the claims which follow:

The embodiments of the invention in which an exclusive property or privilege is claimed are defined as follows:

1. A stabilized integrated transimpedance amplifier comprising:

an amplifier integrated on a substrate, said amplifier having a supply voltage and at least one input comprising voltage dependent integrated circuit capacitors; and coupling capacitors integrated into the amplifier substrate, said amplifier being adapted to have open loop amplification characteristics which compensate for changes in capacitance of said integrated circuit capacitors by varying the supply voltage of said amplifier, the bandwidth of said amplifier stabilized by modifying the open loop gain of said amplifier such that the gain is substantially inversely related to said supply voltage.

2. The amplifier of claim 1 wherein said amplifier provides integrated circuit transconductance amplification with integrated capacitive input coupling, wherein the parasitic capacitance of said input coupling increases with decreasing supply voltage.

3. An integrated circuit transconductance amplifier, comprising:

an amplifier having input and output ports, a power supply and an input hi-pass coupling capacitor, the capacitor comprising an integrated circuit function device biased by said supply voltage, the parasitic capacitance of said capacitor increasing with decreasing supply voltage, the capacitor coupled to an input port of said amplifier; wherein the open loop gain of said amplifier is substantially inversely related to said supply voltage.

4. The transconductance amplifier of claim 3 wherein said integrated circuit capacitor comprises a structure atop a substrate common to both said amplifier and capacitor and said integrated circuit capacitor biasing depends on the said supply voltage.

5. The transconductance amplifier of claim 4 wherein said amplifier comprises at least one amplifying transistor connected to a loading impedance and a bias current element, said current element controlling bias current through said transistor, wherein the relationship between the current element and the supply voltage is substantially inverse.

6. The transconductance amplifier of claim 5 wherein said amplifier comprises a differential amplifier, said differential amplifier including paired amplifying transistors, each amplifying transistor having a loading impedance, said bias current element being connected to said paired amplifying transistors to control bias current of said transistors.

7. The transconductance amplifier of claim 5 wherein said bias current element comprises a transistor connected to a first reference current source which forms a first current mirror circuit, wherein current flowing through said bias current element transistor is proportional to said current flowing through said reference current source and said reference current source is adapted such that said current flowing through said first reference current source is substantially inversely proportional to said supply voltage.

8. The transconductance amplifier of claim 7 further comprising a second current mirror circuit having a transistor and a reference current source, wherein said first reference source is biased by a fixed reference voltage and is connected in parallel to said mirror transistor element of a second current mirror circuit, said second current mirror circuit having a second reference current source biased by the supply voltage, wherein current from said second current mirror circuit acts subtractively to reduce current in said first current mirror circuit.

9. The transconductance amplifier of claim 6 wherein said differential amplifier comprises paired amplifying transistors, the collectors of said amplifying transistors connected to a common emitter said amplifying transistors having respective collector resistance elements, with said current control device connected to the emitter of said amplifying transistors.

10. The transconductance amplifier of claim 6 further comprising a photo diode, said photo diode and transconductance amplifier forming a photosensitive receiver wherein said photo diode is reverse biased and connected across the inputs of said transconductance amplifier by at least one of said high pass input capacitors.

11. The transconductance amplifier of claim 7 further comprising a photo diode, said photo diode and transconductance amplifier forming a photosensitive receiver wherein said photo diode is reverse biased and connected across the inputs of said transconductance amplifier by at least one of said high pass input capacitors.

12. The transconductance amplifier of claim 8 further comprising a photo diode, said photo diode and transconductance amplifier forming a photosensitive receiver wherein said photo diode is reverse biased and connected across the inputs of said transconductance amplifier by at least one of said high pass input capacitors.

13. The transconductance amplifier of claim 6 in which said bias current element comprises a transistor connected to a first reference current source which forms a first current mirror circuit, wherein current flowing through said bias current element transistor is proportional to said current flowing through said reference current source and said reference current source is adapted such that said current flowing through said first reference current source is substantially inversely proportional to said supply voltage.

14. The transconductance amplifier of claim 11 further comprising a second current mirror circuit having a transistor and a reference current source, wherein said first reference source is biased by a fixed reference voltage and is connected in parallel to said mirror transistor element of a second current mirror circuit, said second current mirror circuit having a second reference current source biased by the supply voltage, wherein current from said second current mirror circuit acts subtractively to reduce current in said first current mirror circuit.

15. The transconductance amplifier of claim 13 further comprising a photo diode, said photo diode and transconductance amplifier forming a photosensitive receiver wherein said photo diode is reverse biased and connected across the inputs of said transconductance amplifier by at least one of said high pass input capacitors.

16. The transconductance amplifier of claim 14 further comprising a photo diode, said photo diode and transconductance amplifier forming a photosensitive receiver wherein said photo diode is reverse biased and connected across the inputs of said transconductance amplifier by at least one of said high pass input capacitors.

* * * * *